US012439539B2

(12) United States Patent
Lee et al.

(10) Patent No.: US 12,439,539 B2
(45) Date of Patent: Oct. 7, 2025

(54) TRANSPARENT MEMBER, ELECTRONIC DEVICE INCLUDING SAME, AND THERMOFORMING METHOD OF TRANSPARENT MEMBER (71) Applicant: Samsung Electronics Co., Ltd., Gyeonggi-do (KR)

(72) Inventors: Hosoon Lee, Gyeonggi-do (KR); Juree Kim, Gyeonggi-do (KR); Sangung An, Gyeonggi-do (KR); Junseok Kim, Gyeonggi-do (KR); Jongcheol Jang, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 44 days.

(21) Appl. No.: 17/994,135

(22) Filed: Nov. 25, 2022

(65) Prior Publication Data
US 2023/0088012 A1    Mar. 23, 2023

Related U.S. Application Data (63) Continuation of application No. PCT/KR2022/008383, filed on Jun. 14, 2022.

(30) Foreign Application Priority Data

Jun. 14, 2021  (KR) .................. 10-2021-0076829

(51) Int. Cl.
*H05K 5/03* (2006.01)
*B29C 43/02* (2006.01)
(Continued)

(52) U.S. Cl.
CPC ............... *H05K 5/03* (2013.01); *B29C 43/02* (2013.01); *B29C 43/32* (2013.01); *B29C 51/267* (2013.01);
(Continued)

(58) Field of Classification Search
None
See application file for complete search history.

(56) References Cited

U.S. PATENT DOCUMENTS 3,149,948 A  *  9/1964  Seymour ................. C03B 23/22
                                                    65/156
12,240,779 B2     3/2025  Li et al.
(Continued)

FOREIGN PATENT DOCUMENTS

CN     106746526 A    5/2017
CN     108002689 A    5/2018
(Continued)

OTHER PUBLICATIONS

WO 2019/167850 machine translation, Li Qing et al., Crystallized Glass of Three Dimensional Shape, Sep. 2019 (Year: 2019).*
(Continued)

*Primary Examiner* — Queenie S Dehghan
(74) *Attorney, Agent, or Firm* — Cha & Reiter, LLC.

(57) ABSTRACT

A method of forming a transparent member according to an embodiment may include: a process of putting a first transparent substrate and a second transparent substrate into a first cavity of a lower mold that has a first depth and a second cavity of a lower mold that is connected to the first cavity and has a second depth, respectively; a process of disposing an upper mold, which corresponds to the lower mold and includes a pressing portion having at least one pressing surface, on an upper portion of the lower mold; a process of preheating at least one of the lower mold in which the transparent substrates are disposed or the upper mold to a predetermined temperature; and a process of thermoforming the preheated transparent substrates by pressing the preheated transparent substrates in a manner of pressing the
(Continued)

upper mold. Various other embodiments identified through the specification are possible.

5 Claims, 9 Drawing Sheets

(51) Int. Cl.
  *B29C 43/32*   (2006.01)
  *B29C 51/26*   (2006.01)
  *C03B 23/02*   (2006.01)
  *C03B 23/03*   (2006.01)
  *B29L 31/34*   (2006.01)
  *H04M 1/02*   (2006.01)

(52) U.S. Cl.
  CPC .............. *C03B 23/02* (2013.01); *C03B 23/03* (2013.01); *C03B 23/0307* (2013.01); *B29K 2995/0026* (2013.01); *B29L 2031/3437* (2013.01); *H04M 1/0249* (2013.01)

(56) References Cited

U.S. PATENT DOCUMENTS

| | | |
|---|---|---|
| 2012/0144866 A1 | 6/2012 | Liu et al. |
| 2016/0137550 A1 | 5/2016 | Murata et al. |
| 2017/0349472 A1 | 12/2017 | Jung et al. |
| 2018/0117804 A1 | 5/2018 | Chang et al. |

FOREIGN PATENT DOCUMENTS

| | | |
|---|---|---|
| JP | 8-277136 A | 10/1996 |
| JP | 2013-228669 A | 11/2013 |
| JP | 2014-91655 A | 5/2014 |
| JP | 2014-94849 A | 5/2014 |
| JP | 2019-43835 A | 3/2019 |
| KR | 10-2011-0091327 A | 8/2011 |
| KR | 10-2014-0111403 A | 9/2014 |
| KR | 10-1598337 B1 | 3/2016 |
| KR | 10-1621216 B1 | 5/2016 |
| KR | 10-2016-0075300 A | 6/2016 |
| KR | 10-2017-0131128 A | 11/2017 |
| KR | 10-2018-0085522 A | 7/2018 |
| KR | 10-2019-0072017 A | 6/2019 |
| KR | 10-2020-0064694 A | 6/2020 |
| KR | 10-2157060 B1 | 9/2020 |
| WO | 2019167850 A1 | 9/2019 |

OTHER PUBLICATIONS

CN 108002689 machine translation, Zhang Zhi-Hao et al., Forming mold and forming method, May 2018 (Year: 2018).*
Extended European Search Report dated Jul. 2, 2024.
Korean Notice of Preliminary Rejection dated Jul. 14, 2025.

* cited by examiner

TRANSPARENT MEMBER, ELECTRONIC DEVICE INCLUDING SAME, AND THERMOFORMING METHOD OF TRANSPARENT MEMBER

CLAIM OF PRIORITY

This application is a continuation of International Application No. PCT/KR2022/008383, filed on Jun. 14, 2022, which claims priority to Korean Patent Application No. 10-2021-0076829, filed on Jun. 14, 2021, in the Korean Intellectual Property Office, which is incorporated by reference in its entirety.

BACKGROUND

1. Technical Field

Certain embodiments disclosed herein relate to a transparent member, an electronic device including the same, and a method of thermoforming the transparent member.

2. Description of Related Art

An electronic device may have an angular shape as well as a curved edge portion to improve aesthetics. Alternatively, an electronic device may have a surface that has a plurality of heights in order to dispose components (e.g., a camera) of the electronic device. In addition, at least one surface of the electronic device may have glass. The glass protects the external portion of the electronic device. The glass formed on the external portion of the electronic device may have a shape corresponding to the shape of the surfaces of the electronic device.

The shape of the glass may be made by using a polishing method of manufacturing a curved surface by grinding the glass surface with a grinder, or by using a thermoforming method of heating glass and then bending or pressing the glass to form the glass.

In the case of forming glass using the thermoforming method, flat glass may be placed between upper and lower molds and the molds are pressed at a certain temperature and pressure, thereby producing glass corresponding to the shape of a cavity defined in the molds.

As a glass forming method used in an electronic device, a method of grinding a glass surface such as a Computerized Numerical Control (CNC) process may be used. By the forming method performed through the grinding, a CNC tool mark, a step, or thermoforming wrinkles may occur on the glass. Accordingly, the surface quality of the glass may deteriorate. In addition, a post-process (e.g., a polishing process) for improving the surface quality may be required. Therefore, the manufacturing cost is increased, and the forming time is long, which may cause a problem in that the productivity is decreased.

Various embodiments disclosed herein able to provide a transparent member including bending glass including a curved surface or glass having a partially asymmetric shape in the thickness of one surface, and a method of thermoforming the transparent member with molds.

SUMMARY

A transparent member forming method according to various embodiments of the disclosure may include: a process of putting a first transparent substrate and a second transparent substrate into a first cavity of a lower mold that has a first depth and a second cavity of a lower mold that is connected to the first cavity and has a second depth, respectively; a process of disposing an upper mold, which corresponds to the lower mold and includes a pressing portion having at least one pressing surface, on an upper portion of the lower mold; a process of preheating at least one of the lower mold in which the transparent substrates are disposed or the upper mold to a predetermined temperature; and a process of thermoforming the preheated transparent substrates by pressing the preheated transparent substrates in a manner of pressing the upper mold.

A transparent member according to various embodiments of the disclosure may be formed through: a process of putting a first transparent substrate and a second transparent substrate into a first cavity of a lower mold that has a first depth and a second cavity of a lower mold that is connected to the first cavity and has a second depth, respectively; a process of disposing an upper mold, which corresponds to the lower mold and includes a pressing portion having at least one pressing surface, on an upper portion of the lower mold; a process of preheating at least one of the lower mold in which the transparent substrates are disposed or the upper mold to a predetermined temperature; and a process of thermoforming the preheated transparent substrates by pressing the preheated transparent substrates in a manner of pressing the upper mold.

The transparent member according to various embodiments of the disclosure may include a first region having a first thickness, a second region having a second thickness greater than the first thickness, and a bonded portion in which the first region and the second region are at least partially melted and bonded to each other.

An electronic device according to various embodiments of the disclosure may include: a display; a rear cover disposed on a surface opposite to the display; and a side housing enclosing a space between the display and the back cover. At least one of the rear covers may include a transparent member including a first region having a first thickness, a second region having a second thickness greater than the first thickness, and a bonded portion in which the first region and the second region are at least partially melted and bonded to each other.

BRIEF DESCRIPTION OF THE DRAWINGS

In connection with the description of the drawings, the same or similar components may be denoted by the same or similar reference numerals.

DETAILED DESCRIPTION

According to certain embodiments disclosed herein, it is possible to provide a transparent member formed through a thermoforming process using molds without a separate CNC process and a method for thermoforming a transparent member. Due to this, the time required for a CNC machining process and a polishing process for removing a CNC tool mark may be reduced.

In addition, according to certain embodiments, transparent substrates corresponding a thick portion and a thin film portion are separately put into a transparent member thermoforming mold, and the respective transparent substrates are bonded to each other during thermoforming. Therefore, it is possible to implement a curved shape or a shape having a partially different thickness on one surface.

Furthermore, according to certain embodiments, since the lower mold includes at least one air passage, it is possible to prevent pores, which are generated melting and bonding of the transparent substrates, from being formed in the transparent member.

In addition, various effects directly or indirectly identified through the disclosure may be provided.

Hereinafter, various embodiments of the disclosure will be described in detail with reference to the accompanying drawings. However, it should be appreciated that they are not intended to limit the disclosure to particular embodiments and the disclosure includes various modifications, equivalents, and/or alternatives for various embodiments of the disclosure.

Figure 1:
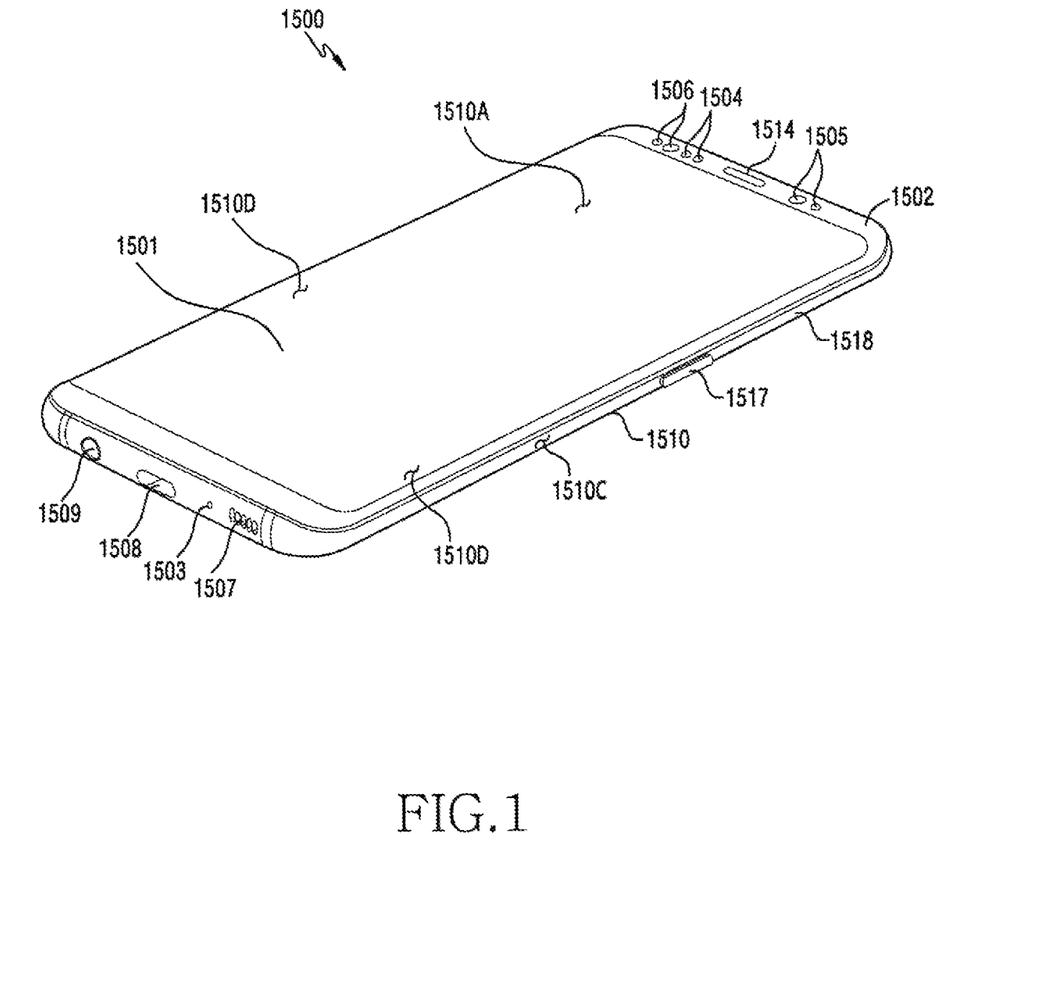
FIG. 1 is a front perspective view of an electronic device according to an embodiment.

FIG. 1 describes a housing of an electronic device. The housing includes a front plate 1502 that is transparent. The front plate 1502 may be made of glass, plastic, or a combination of both.

Glass protects the external portion of the electronic device. The glass formed on the external portion of the electronic device may have a shape corresponding to the shape of the surfaces of the electronic device. The shape of the glass may be made by polishing a curved surface.

Electronic Device Housing

An electronic device according to various embodiments of the disclosure may include at least one of, for example, a smartphone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., watch, ring, bracelet, anklet, necklace, glasses, contact lens, or head-mounted device (HMD)), a fabric or clothing-integrated type (e.g., electronic clothing), a body-mounted type (e.g., skin pad, or tattoo), and a bio-implantable type (e.g., implantable circuit).

According to some embodiments, the electronic device may include at least one of, for example, a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box, a game console, an electronic dictionary, an electronic key, a camcorder, and an electronic photo frame.

According to other embodiments, the electronic device may include at least one of various medical devices (e.g., various portable medical measuring devices (blood glucose monitoring device, heart rate monitoring device, blood pressure measuring device, body temperature measuring device, etc.), magnetic resonance angiography (MRA), magnetic resonance imaging (MRI), computed tomography (CT) machine, ultrasonic machine, etc.), a navigation device, a global positioning system (GPS) receiver, an event data recorder (EDR), a flight data recorder (FDR), a vehicle infotainment device, electronic equipment for a ship (e.g., ship navigation device, gyro-compass, etc.), avionics, a security device, an automobile head unit, a home or industrial robot, an automatic teller's machine (ATM) in banks, point of sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.).

According to some embodiments, the electronic device may include at least one of a part of furniture or a building/structure, an electronic board, an electronic signature receiving device, a projector, and various kinds of measuring instruments (e.g., water meter, electric meter, gas meter, radio wave meter, etc.). In various embodiments, the electronic device may be a combination of one or more of the aforementioned various devices. According to some embodiments, the electronic device may also be a flexible device. Further, the electronic device according to an embodiment of the disclosure is not limited to the aforementioned devices, and may include a new electronic device according to the development of technology.

Figure 2:
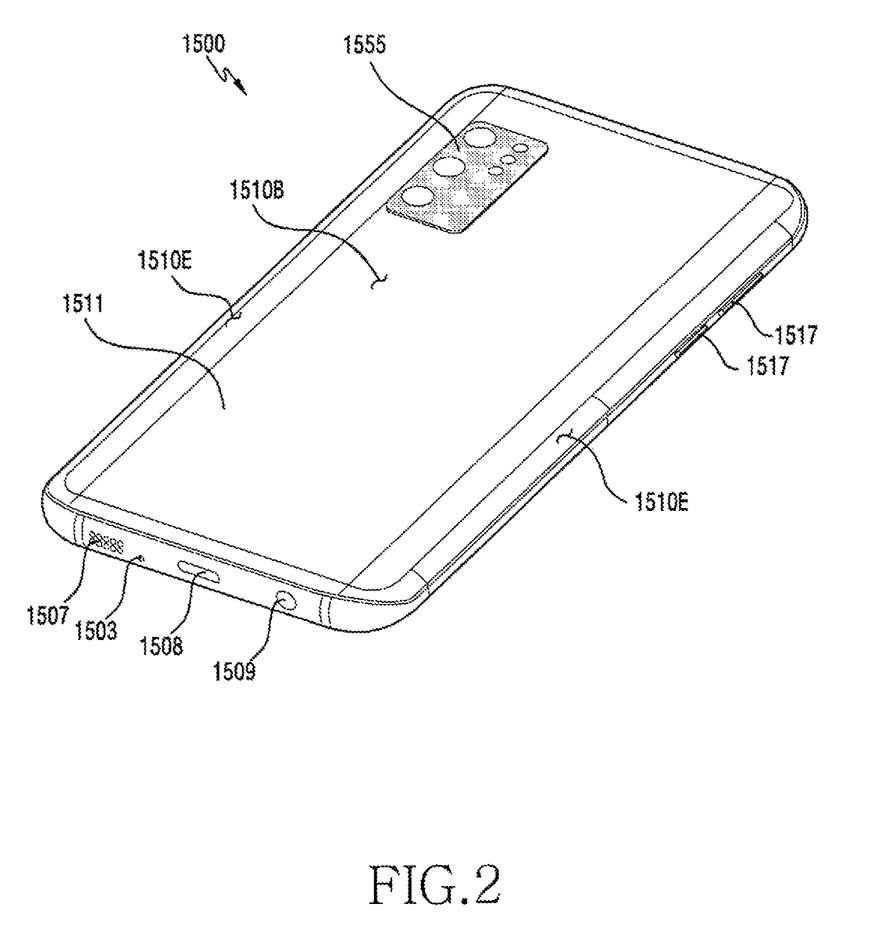
FIG. 2 is a rear perspective view of the electronic device according to an embodiment.

FIG. 1 is a front perspective view of an electronic device 1500 according to an embodiment, and FIG. 2 is a rear perspective view of the electronic device 1500 according to an embodiment.

Referring to FIGS. 1 and 2, according to an embodiment, the electronic device 1500 may include a housing 1510 including a first surface (or a front surface) 1510A, a second surface (or a rear surface) 1510B, and a side surface 1510C surrounding the space between the first surface 1510A and the second surface 1510B. In another embodiment (not illustrated), the housing may mean a structure defining some of the first surface 1510A of FIG. 1, the second surface 1510B, and the side surface 1510C of FIG. 2. According to an embodiment, at least a portion of the first surface 1510A may be defined by a substantially transparent front plate 1502 (e.g., a glass plate or a polymer plate including various coating layers as the front plate). In another embodiment, the front plate 1502 may be coupled to the housing 1510 so as to define an inner space with the housing 1510. In various embodiments, the term "internal space" may mean a space accommodating at least a portion of the display 1501 as an internal space of the housing 1510.

According to various embodiments, the second surface 1510B may be defined by a substantially opaque rear plate 1511. The rear plate 1511 may be made of, for example, coated or colored glass, ceramic, polymer, metal (e.g., aluminum, stainless steel (STS), or magnesium), or a combination of two or more of these materials. The side surface 1510C may be provided by a side bezel structure (or a "side member") 1518 coupled to the front plate 1502 and the rear plate 1511 and including a metal and/or a polymer. In various embodiments, the rear plate 1511 and the side bezel structure 1518 may be integrally configured, and may include the same material (e.g., a metal material such as aluminum).

In the illustrated embodiment, the front plate 1502 may include two first regions 1510D (e.g., curved regions), which are bent from the first surface 1510A toward the rear plate 1511 and extend seamlessly, at the long opposite side edges thereof. In the illustrated embodiment, the rear plate 1511 may include two second regions 1510E (e.g., curved regions), which are bent from the second face 1510B toward the front plate 1502 and extend seamlessly, at the long opposite side edges thereof. In various embodiments, the front plate 1502 (or the rear plate 1511) may include only one of the first regions 1510D (or the second regions 1510E). In another embodiment, some of the first regions 1510D or the second regions 1510E may not be included. In the above-described embodiments, when viewed from a side of the electronic device 1500, the side bezel structure 1518 may have a first thickness (or width) on the side surface in which the first regions 1510D or the second regions 1510E are not included (e.g., the side surface in which the connector hole 1508 is disposed), and may have a second thickness, which is smaller than the first thickness, on the side surface in which the first regions 1510D or the second regions 1510E are included (e.g., the side surfaces in which the key input devices 1517 are disposed).

According to an embodiment, the electronic device 1500 may include at least one of a display 1501, audio modules 1503, 1507, and 1514, sensor modules 1504, camera modules 1505 and 1555, key input devices 1517, light-emitting elements 1506, and connector holes 1508 and 1509. In various embodiments, at least one of the components (e.g., the key input devices 1517 or the light-emitting elements 1506) may be omitted from the electronic device 1500, or the electronic device 1500 may additionally include other components.

The display 1501 may be visually exposed through, for example, a considerable portion of the front plate 1502. In various embodiments, at least a portion of the display 1501 may be visually exposed through the front plate 1502 defining the first surface 1510A and the first regions 1510D of the side surfaces 1510C. In various embodiments, the edges of the display 1501 may be configured to be substantially the same as the contour shape of the front plate 1502 adjacent thereto. In another embodiment (not illustrated), the distance between the periphery of the display 1501 and the periphery of the front plate 1502 may be substantially constant in order to increase the exposed area of the display 1501.

In another embodiment (not illustrated), recesses or openings may be provided in a portion of a screen display region (e.g., an active region) or a region (e.g., a non-active region) out of the screen display region of the display 1501, and at least one of the audio module 1514, the sensor modules 1504, the camera modules 1505 and 1555, and the light-emitting elements 1506, which are aligned with the recesses or the openings, may be included. In another embodiment (not illustrated), the rear surface of the screen display region of the display 1501 may include at least one of the audio module 1514, the sensor modules 1504, the camera modules 1505 and 1555, and the light-emitting elements 1506. In another embodiment (not illustrated), the display 1501 may be coupled to or disposed adjacent to a touch-sensing circuit, a pressure sensor capable of measuring the intensity of a touch (pressure), and/or a digitizer that detects an electromagnetic-field-type stylus pen. In some embodiments, at least some of the sensor modules 1504 and/or at least some of the key input devices 1517 may be disposed in the first regions 1510D and/or the second regions 1510E.

The audio modules 1503, 1507, and 1514 may include a microphone hole 1503 and speaker holes 1507 and 1514. The microphone hole 1503 may include a microphone disposed therein so as to acquire external sound, and in various embodiments, multiple microphones may be disposed therein so as to detect the direction of sound. The speaker holes 1507 and 1514 may include an external speaker hole 1507 and a call receiver hole 1514. In various embodiments, the speaker holes 1507 and 1514 and the microphone hole 1503 may be implemented as a single hole, or a speaker (e.g., a piezo speaker) may be included without the speaker holes 1507 and 1514.

The sensor module 1504 may generate electrical signals or data values corresponding to the internal operating states or the external environmental states of the electronic device 1500. The sensor modules 1504 may include, for example, a first sensor module 1504 (e.g., a proximity sensor), a second sensor module (not illustrated) (e.g., a fingerprint sensor) disposed on the first surface 1510A of the housing 1510, and/or another sensor module (not illustrated) (e.g., an HRM sensor or a fingerprint sensor) disposed on the second surface 1510B of the housing 1510. The fingerprint sensor may be disposed not only on the first surface 1510A (e.g., the display 1501) of the housing 1510, but also on the second surface 1510B. The electronic device 1500 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 1505 and 1555 may include a first camera device 1505 disposed on the first surface 1510A of the electronic device 1500 and a second camera device 1555 disposed on the second surface 1510B of the electronic device 1500. The camera modules 1505 and 1555 may include one or more lenses, an image sensor, and/or an image signal processor. A flash (not illustrated) may be disposed on the second surface 1510B. The flash may include, for example, a light-emitting diode or a xenon lamp. In s, two or more lenses (e.g., an infrared camera lens, a wide-angle lens, and a telephoto lens) and image sensors may be disposed on one surface of the electronic device 1500.

The key input devices 1517 may be disposed on the side surface 1510C of the housing 1510. In another embodiment, the electronic device 1500 may not include some or all of the above-mentioned key input devices 1517, and a key input device 1517, which is not included in the above mentioned key input devices, may be implemented in another form, like a soft key, on the display 1501.

The light-emitting elements 1506 may be disposed, for example, on the first surface 1510A of the housing 1510. The light-emitting elements 1506 may provide, for example, information about the state of the electronic device 1500 in an optical form. In another embodiment, the light-emitting elements 1506 may provide a light source that is interlocked with, for example, the operation of the camera modules 1505. The light emitting elements 1506 may include, for example, an LED, an IR LED, and a xenon lamp.

The connector holes 1508 and 1509 may include a first connector hole 1508, which is capable of accommodating a connector (e.g., a USB connector) for transmitting/receiving power and/or data to/from an external electronic device, and/or a second connector hole 1509, which is capable of accommodating a connector (e.g., an earphone jack) for transmitting/receiving an audio signal to/from an external electronic device.

As a glass forming method used in an electronic device, a method of grinding a glass surface such as a Computerized Numerical Control (CNC) process may be used. By the forming method performed through the grinding, a CNC tool mark, a step, or thermoforming wrinkles may occur on the glass. Accordingly, the surface quality of the glass may deteriorate. In addition, a post-process (e.g., a polishing process) for improving the surface quality may be required. This increases the manufacturing costs and production time.

Certain embodiments disclosed herein are able to provide a transparent member including bending glass including a curved surface or glass having a partially asymmetric shape in the thickness of one surface, and a method of thermoforming the transparent member with molds.

Figure 3:
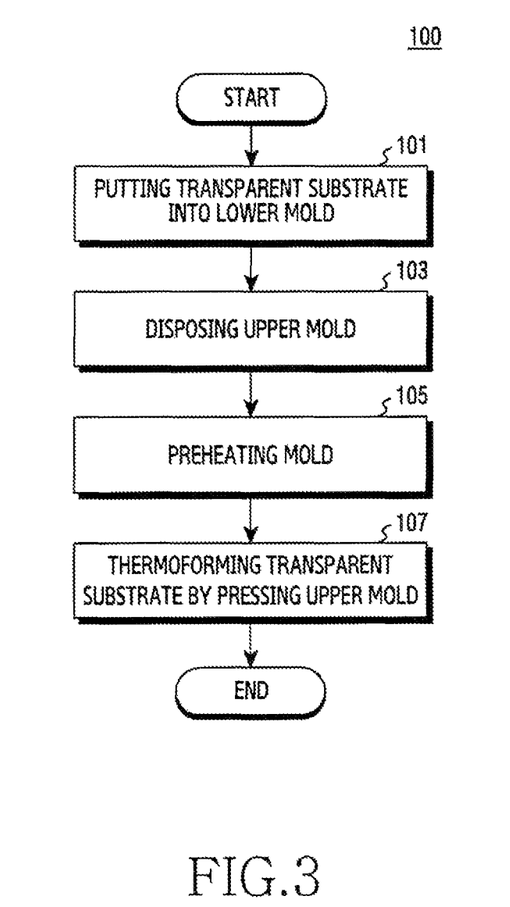
FIG. 3 is a flowchart illustrating a transparent member forming method according to an embodiment.

FIG. 3 is a flowchart illustrating a method of forming a transparent member according to an embodiment.

Referring to FIG. 3, a transparent member forming method (100) according to an embodiment may include a process of putting a transparent substrate into a lower mold (101), a process of disposing an upper mold (103), a process of preheating the molds (105), and a process of thermoforming the transparent substrates by pressing the upper mold (107).

According to an embodiment, in the process of putting the transparent substrates into the lower mold (101), the plurality of transparent substrates may be put into the lower mold. For example, the plurality of transparent substrates may be put respectively into a plurality of cavities in the lower mold. The plurality of transparent substrates put into the cavities may be formed in at least one of the process of preheating the molds (105) or the process of thermoforming the transparent substrates by pressing the upper mold (107). However, the disclosure is not limited thereto.

According to various embodiments, the transparent member forming method 100 may further include one or more other processes. For example, the transparent member forming method (100) may further includes at least one of a process of polishing at least a portion of one surface of each of the thermoformed transparent substrates or a process of reinforcing the thermoformed transparent substrates. According to an embodiment, a process of reinforcing the transparent substrates may be performed after the polishing process. According to an embodiment, the polishing process may be performed on a part or all of the surface of the transparent member according to an intended use of the transparent member. The external roughness and strength of the transparent member may be improved due to the polishing process. However, the disclosure is not limited thereto. Specific details of each process of the transparent member forming method (100) according to an embodiment will be described later.

According to an embodiment, the transparent substrates may include at least one of soda-lime glass, glass containing lead monoxide in a lead glass composition (lead-alkali glass), borosilicate glass, aluminosilicate glass, or silica glass. However, the disclosure is not limited thereto. For example, the transparent substrates are used for a display or a cover of an electronic device and may include various members having a thermoplastic property.

Figure 4:
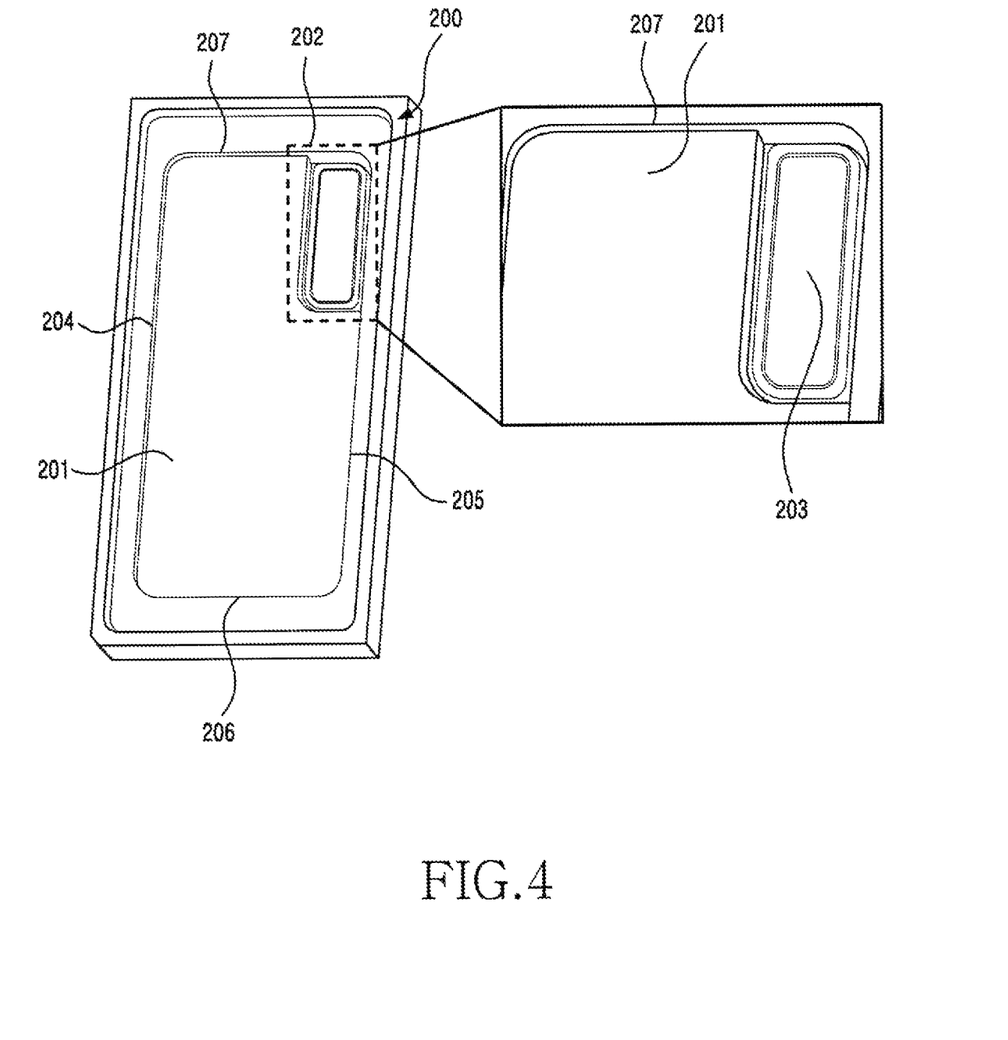
FIG. 4 is a perspective view illustrating a lower mold according to an embodiment.
Figure 5:
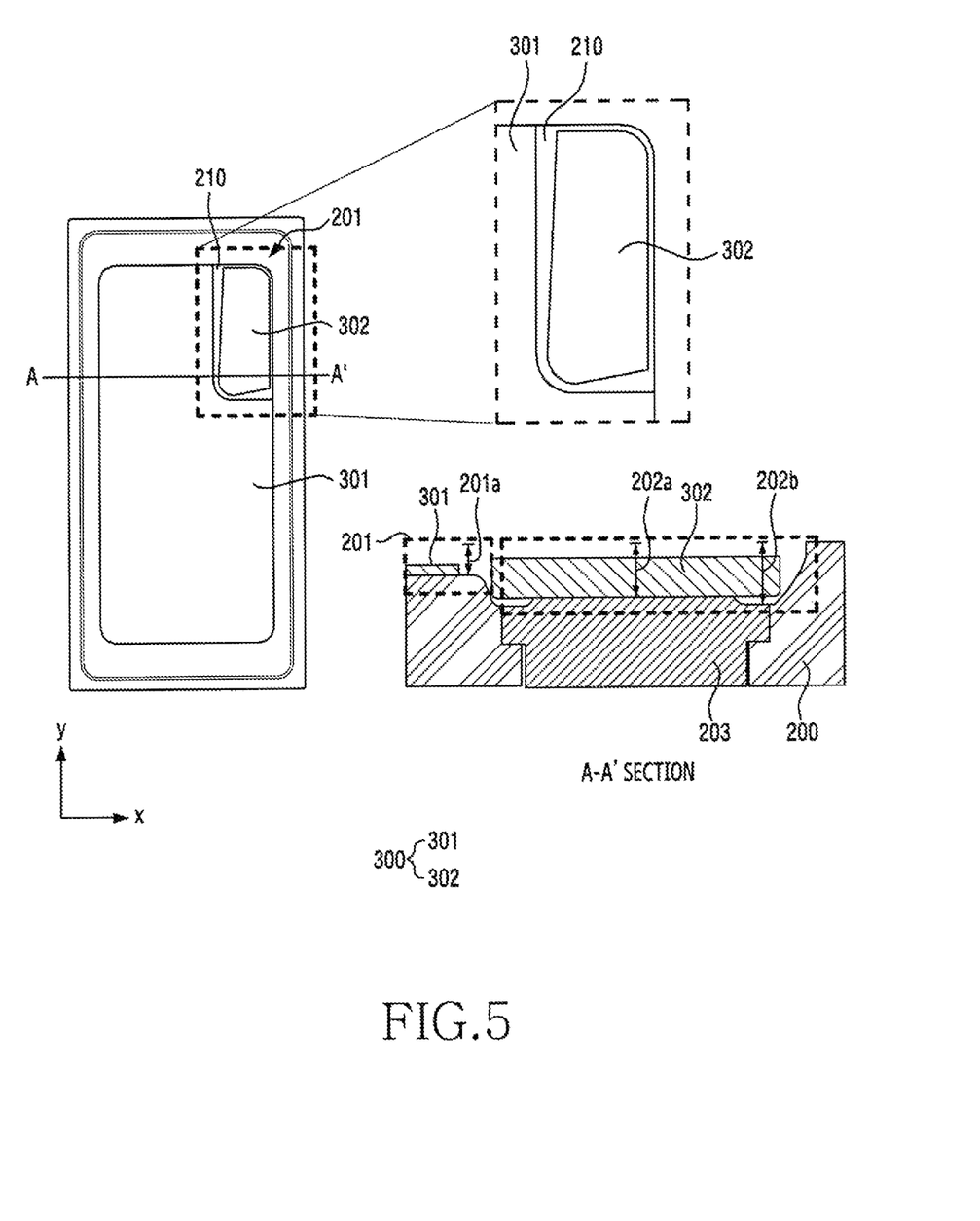
FIG. 5 is a perspective view illustrating a state in which transparent substrates are put into the lower mold according to an embodiment.

FIG. 4 is a perspective view illustrating a lower mold according to an embodiment. FIG. 5 is a perspective view illustrating a state in which transparent substrates are put into the lower mold according to an embodiment. The lower mold may be used in operation 101.

Referring to FIGS. 4 and 5, the lower mold 200 according to an embodiment may include a cavity, which is a space in which a transparent substrate is formed. According to an embodiment, the cavity may include a first cavity 201 and a second cavity 202. The first cavity 201 and the second cavity 202 may be connected to each other. The first cavity 201 may have a first depth 201a. The second cavity 202 may have a second depth 202a. The second depth 202a may be greater than the first depth 201a. However, according to another embodiment, the shape of the cavities may have a shape different from the shape illustrated in FIGS. 4 and 5. For example, referring to the cross section (A-A' section) of FIG. 5, the second cavity 202 may further have a third depth 202b. According to various embodiments, the cavity may be defined to correspond to the shape of the transparent member to be formed. For example, the first cavity 201 may have a shape corresponding to the shape of the thin film portion of the rear cover of the electronic device. The second cavity 202 may have a shape corresponding to a thick portion that includes a rear camera hole of the electronic device. However, the disclosure is not limited thereto. The thick portion may refer to a portion protruding from the exterior of the electronic device compared to the thin film portion.

According to an embodiment, the lower mold 200 may include a bottom portion, first and second sidewalls 204 and 205, and third and fourth sidewalls 206 and 207. The first sidewall 204 and the second sidewall 205 may face each other. The third sidewall 206 and the fourth sidewall 207 may face each other.

According to an embodiment, at least one of the first sidewall 204, the second sidewall 205, the third sidewall 206, and the fourth sidewall 207 may have a curved shape. For example, the sidewalls may include a curved shape that is seamlessly extended by being bent in a direction from the bottom portion toward the upper mold 400. For this reason, an edge of the transparent member thermoformed by the molds may include a curved portion.

The cavities according to an embodiment may be spaces defined by at least some of the bottom portion, the first and second sidewalls 204 and 205, and the third and fourth sidewalls 206 and 207. Accordingly, a step may be present between the bottom portion corresponding to the first cavity 201 and the bottom portion corresponding to the second cavity 202.

According to an embodiment, the lower mold 200 may include a one-sided core 203. This will be described later with reference to FIG. 6.

According to an embodiment, in the process of putting the transparent substrates into the lower mold (101), the transparent substrates may be put into the lower mold. According to an embodiment, the first transparent substrate 301 and the second transparent substrate 302 may be separately put into the lower mold. For example, the first transparent substrate 301 may be disposed in the first cavity 201. The second transparent substrate 302 may be disposed in the second cavity 202.

The thickness of the first transparent substrate 301 according to an embodiment may be approximately 0.6 T. The thickness of the second transparent substrate 302 according to an embodiment may be approximately 2.85 T. However, the disclosure is not limited thereto.

According to an embodiment, the first transparent substrate 301 and the second transparent substrate 302 may have the same color. In this case, the physical properties of the first transparent substrate 301 and the second transparent substrate 302 may be substantially the same. However, the disclosure is not limited thereto. For example, the transparent substrates can be translucent and have colors. When the colors of the first transparent substrate 301 and the second transparent substrate 302 are different from each other, the physical properties of the first transparent substrate 301 and the second transparent substrate 302 may be also different from each other. Furthermore, when the first transparent substrate 301 and the second transparent substrate 302 are different from each other in required strength or refractive index, the physical properties thereof may be different from each other.

According to an embodiment, in the process of putting the transparent substrates into the lower mold (101), the first transparent substrate 301 and the second transparent substrate 302 may be disposed such that a gap 210 is formed therebetween. Referring to the enlarged view of FIG. 5, the width of the gap 210 according to an embodiment may increase from the inner side toward the outer side (e.g., in the +x-axis direction or the +y-axis direction in FIG. 5) with reference to the surface of the completed transparent member. For example, the width of the gap 210 may increase toward a sidewall (e.g., the first sidewall 204) of the lower mold 200.

When the first transparent substrate 301 and the second transparent substrate 302 are disposed such that the width of the gap increases from the inner side to the outer side with reference to the plane on which the surface of the completed transparent member is disposed and the transparent substrates are melted, the first transparent substrate 301 and the second transparent substrate 302 may be bonded to each other from a portion having a smaller gap. Accordingly, it is possible to prevent pores, which would be generated due to the melting and boding of the transparent substrates, from being generated in the transparent member. The pores may be generated in at least one of the inside or the outside of the bonded portion in which the first transparent substrate 301 and the second transparent substrate 302 are bonded to each other.

As another example, in the process of applying heat to the transparent substrates inside the mold, the region in which the first transparent substrate 301 and the second transparent substrate 302 face each other may be melted from the inner side by heating the transparent substrates from the centers of the cavities in which the transparent substrates are placed, respectively.

Figure 6:
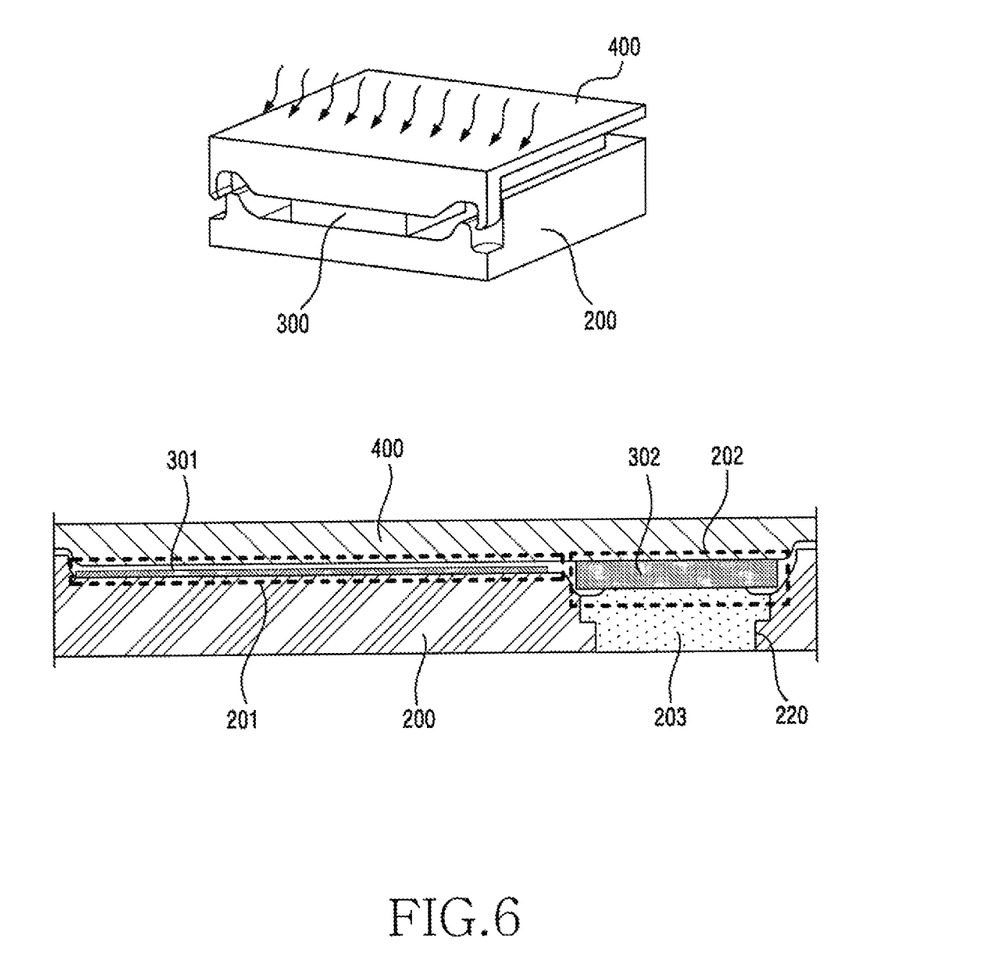
FIG. 6 illustrates a perspective view and a cross-sectional view illustrating a process of disposing the upper mold and a process of preheating the molds according to an embodiment.

FIG. 6 illustrates a perspective view and a cross-sectional view illustrating a process of disposing the upper mold and a process of preheating the molds according to an embodiment, which can be used during operation 103 of FIG. 3.

According to an embodiment, in the process of disposing the upper mold (103), the upper mold 400 may be disposed on the top surface of the transparent substrate 300. According to an embodiment, the upper mold 400 may include a pressing portion. The pressing portion may include at least one pressing surface corresponding to the lower mold 200. For example, the pressing surface may have a shape of a protrusion including a curved edge. However, the disclosure is not limited thereto.

According to an embodiment, at least one of the lower mold 200 or the upper mold 400 is at least one of cold steel tool dice (STD), zirconium 03 ($ZrO_3$), aluminum 203 ($Al_2O_3$), or titanium (Titanium). However, the disclosure is not limited thereto. For example, the molds may include a material having high thermal conductivity, such as graphite or stainless steel (STS). As a result, the mold including the pressing portion may heat the transparent substrate 300.

According to an embodiment, in the process of preheating the mold (105), at least one of the lower mold 200 and the upper mold 400 may be preheated to a predetermined temperature for a predetermined period of time. For example, the thermoforming process may be performed at a temperature equal to or higher than the softening point of the transparent substrate 300. According to an embodiment, a transparent substrate with a softening point of 1100° C./2012° F. or higher may be used. However, the disclosure is not limited thereto.

According to an embodiment, the mold may be heated by an external heating member. For example, the molds may be preheated by putting the molds into a thermoforming machine. However, the disclosure is not limited thereto. For example, the pressing portion may include a heating mechanism that generates heat. As the pressing portion is heated by the heating mechanism, heat from the pressing portion may be transferred to the transparent substrate 300.

According to an embodiment, the transparent substrate 300 may be melted by the heat. For example, when at least one of the lower mold 200 or the upper mold 400 is heated to a predetermined temperature, the transparent substrate 300 may have fluidity for thermoforming. The transparent substrate 300 with secured fluidity may flow along the inside of the mold (e.g., the lower mold 200). For example, after the temperature of the first transparent substrate 301 is increased, fluidity may be secured such that the first transparent substrate is capable of flowing along the inside of the first cavity 201. After the temperature of the second transparent substrate 302 is increased, fluidity may be secured such that the second transparent substrate is capable of flowing along the inside of the second cavity 202.

According to an embodiment, the lower mold 200 may include at least one air passage. The at least one air passage may be connected to the second cavity 202. However, the disclosure is not limited thereto. Referring to FIG. 6, the lower mold 200 according to an embodiment may further include at least one one-sided core 203 disposed in the air passage. The one-sided core 203 may be connected to the second cavity 202. However, the disclosure is not limited thereto.

According to an embodiment, the one-sided core 203 may be separated from the lower mold 200. For example, the one-sided core 203 may be manufactured separately from the lower mold 200 and assembled to the lower mold 200. Accordingly, referring to FIG. 6, at least one gap 220 may be formed between the lower mold 200 and the one-sided core 203. In at least one of the process of preheating the mold (105) or the process of thermoforming the transparent substrates by pressing the transparent substrates with the upper mold (107), when the transparent substrate 300 is melted, air may be discharged through the gap 220. Since the air is discharged through the at least one air passage or the gap 220, it is possible to prevent pores from being generated in the transparent member due to an air trap phenomenon.

Figure 7:
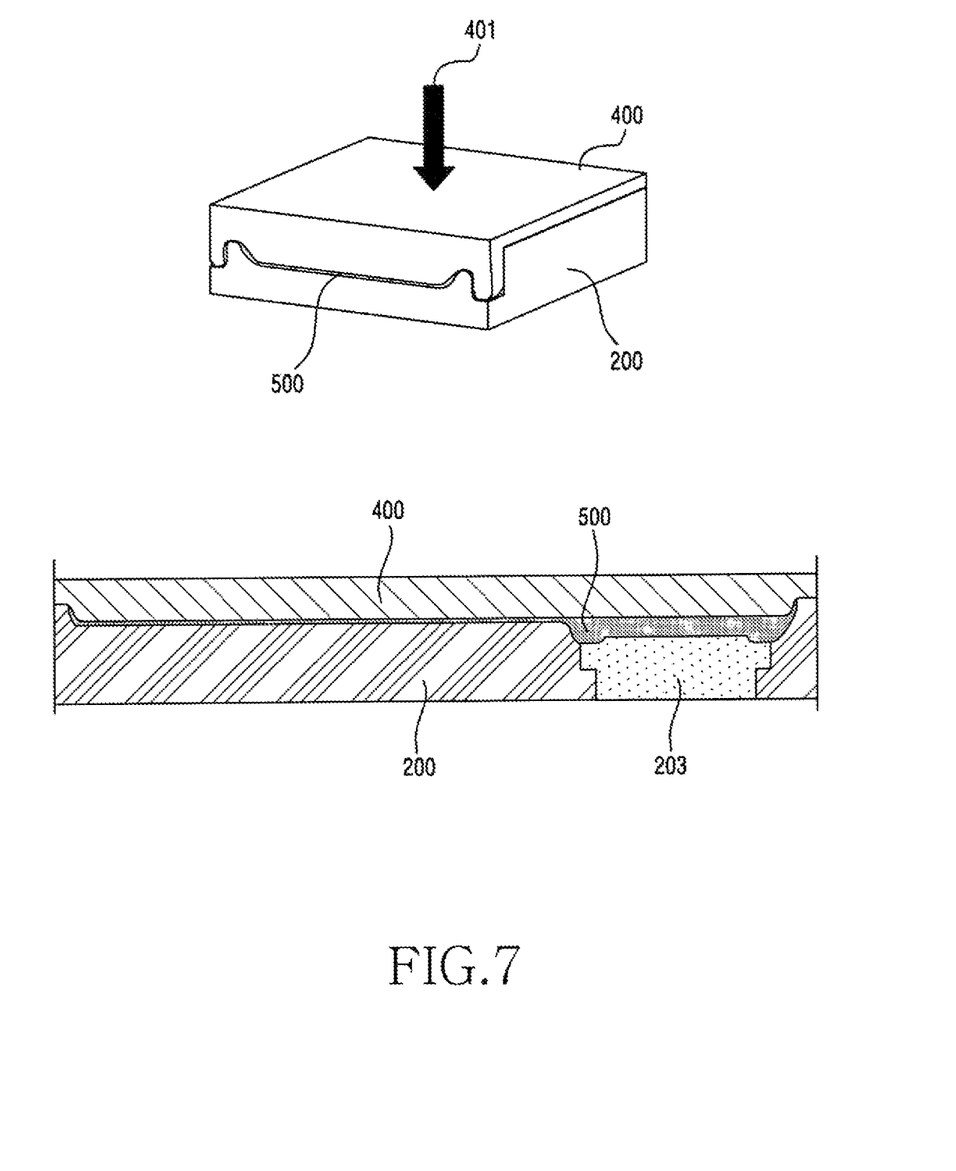
FIG. 7 illustrates a perspective view and a cross-sectional view illustrating a process of pressing the transparent substrate with the upper mold to thermoforming the transparent substrates according to an embodiment.

FIG. 7 illustrates a perspective view and a cross-sectional view illustrating a process of pressing the transparent substrate with the upper mold to thermoforming the transparent substrates according to an embodiment.

The pressing may mean, for example, applying a load from no load (0 kgf) to 100 kgf or more.

According to an embodiment, in the process of thermoforming the transparent substrates by pressing the transparent substrates with the upper mold (107), the transparent substrate 300 may be pressed with the upper mold 400. For example, the lower mold 200 and the upper mold 400 in which the transparent substrate 300 is disposed may be transferred to a press line or a press apparatus may be transferred to the molds to press the transparent substrate 300. Referring to FIG. 7, the transparent substrate 300 may be pressed in a first direction 401. However, the disclosure is not limited thereto.

According to an embodiment, by this pressing operation, the transparent substrate 300 may be deformed by the pressure applied from the upper mold 400. Accordingly, the transparent substrate 300 may be molded to correspond to the shape of the cavity of the lower mold 200. For example, the first transparent substrate 301 may be formed to correspond to the shape of the first cavity 201. The second transparent substrate 302 may be formed to correspond to the shape of the second cavity 202. Due to the shapes of the lower mold 200 and the upper mold 400, the edge of the transparent member 500 may include a curved shape.

According to an embodiment, in at least one of the process of preheating the molds (105) or the process of thermoforming the transparent substrates by pressing the transparent substrates with the upper mold (107), the first transparent substrate (301 in FIG. 6) and the second transparent substrate (302 in FIG. 6) may be melted and bonded to each other. The first transparent substrate and the second transparent substrate which are bonded to each other may form one transparent member 500.

According to an embodiment, the first transparent substrate 301 and the second transparent substrate 302 may be disposed such that the width of the gap therebetween increases from the inner side to the outer side with reference to the surface of the transparent member. When the transparent substrates are melted, the transparent substrates may be bonded to each other starting from a portion in which the width of the gap is smaller. Accordingly, it is possible to prevent pores, which are generated when air is trapped in the process of melting and bonding the transparent substrates, from being generated in the transparent member.

According to an embodiment, in the transparent member 500 thermoformed by being pressed, the thickness of a region corresponding to the first transparent substrate 301 may be 0.5 T. In addition, in the transparent member 500, the thickness of a region corresponding to the second transparent substrate 302 may be 2 T. However, the disclosure is not limited thereto.

Figure 8:
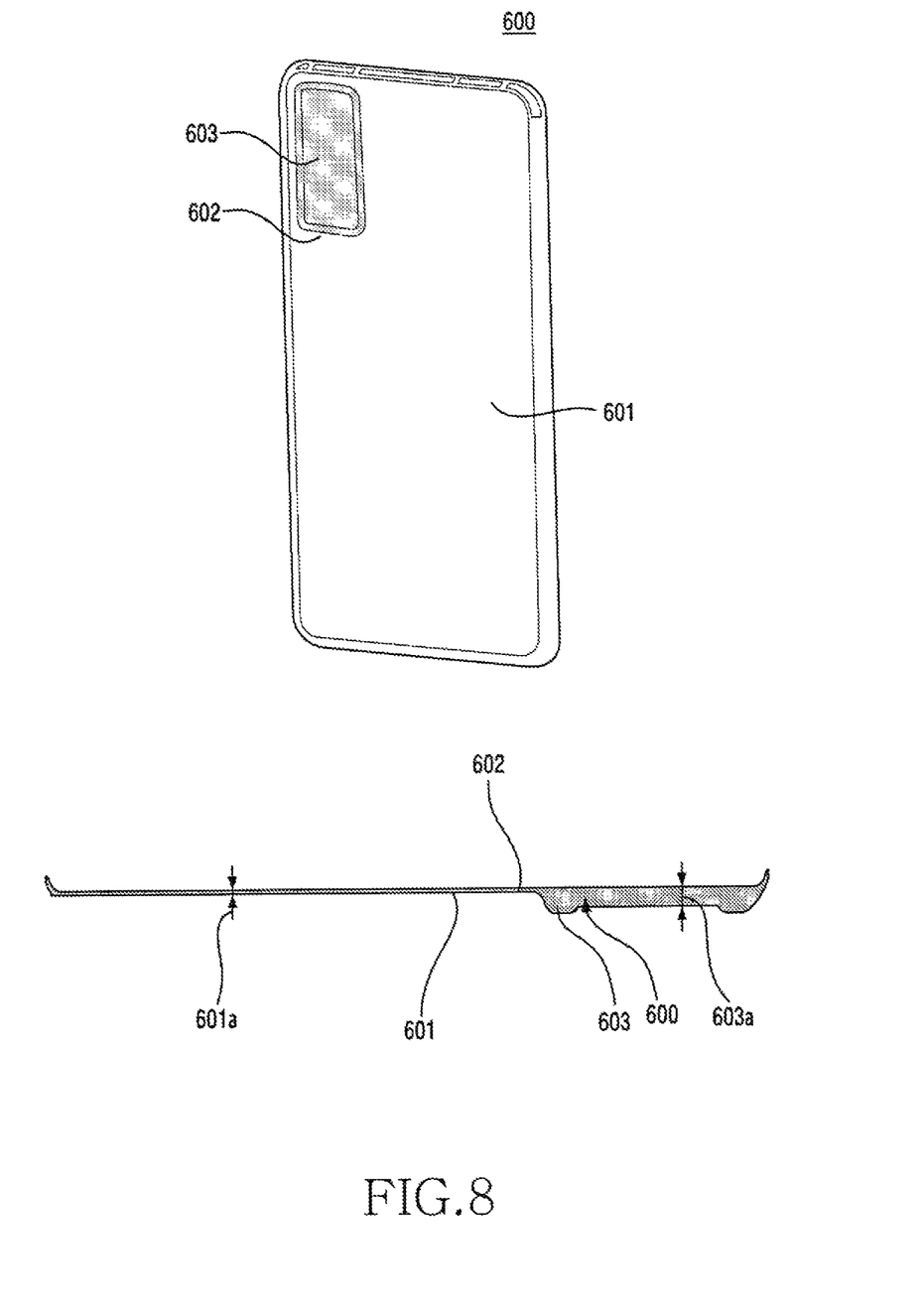
FIG. 8 illustrates a cross-sectional view and a perspective view illustrating a transparent member according to an embodiment.
Figure 9:
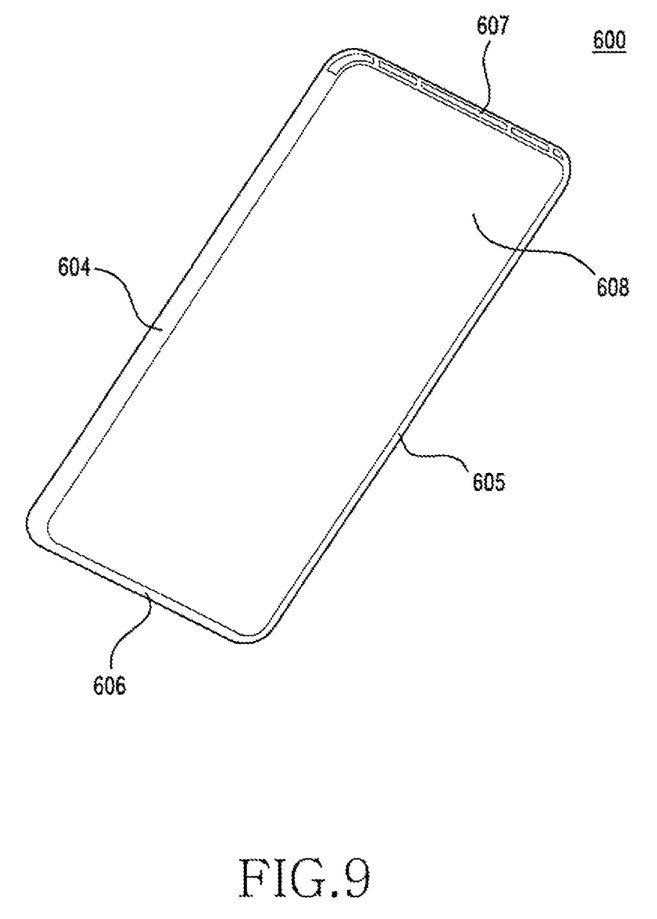
FIG. 9 is a perspective view illustrating the inner surface of the transparent member according to an embodiment.

FIG. 8 illustrates a cross-sectional view and a perspective view illustrating a transparent member according to an embodiment. FIG. 9 is a perspective view illustrating the inner surface of the transparent member according to an embodiment.

The transparent member 600 may be referred to by the transparent member 500 formed through the transparent member forming method (100) of FIGS. 3 to 7. The same reference numerals are used for the same or substantially the same components as those described above, and overlapping descriptions will be omitted.

A transparent member 600 according to an embodiment may be formed by the transparent member forming method (100). For example, the transparent member 600 may be formed by performing a process of putting transparent substrates into a lower mold (101 in FIG. 3), a process of disposing an upper mold (103 in FIG. 3), a process of preheating the mold (105 in FIG. 3), and a process of thermoforming the transparent substrates by pressing the upper mold (107 in FIG. 3). However, the disclosure is not limited thereto. For example, the transparent member 600 may be further subjected to a polishing process on at least a portion of one surface of each of the thermoformed transparent substrates. As another example, the transparent member 600 may be further subjected to a process of reinforcing the transparent substrates after the thermoforming process.

According to an embodiment, in the process of reinforcing the transparent substrate, the transparent substrate may be reinforced. For example, the reinforcing process may be performed at a temperature lower than a strain point of the transparent substrates and above a predetermined temperature. However, the disclosure is not limited thereto. Through the reinforcing process, a target surface compressive stress and reinforcing depth may be achieved in the transparent member.

Referring to FIG. 8, the transparent member 600 according to an embodiment may include a first region 601, a second region 603, and a bonded portion 602. The first region 601 may have a first thickness 601a. The second region 603 may have a second thickness 603a. According to an embodiment, the second thickness 603a may be greater than the first thickness 601a.

According to an embodiment, a difference in thickness between the first region 601 and the second region 603 may be within a range of 0.15 mm to 2.5 mm. However, the disclosure is not limited thereto.

According to an embodiment, the first region 601 may have a plate shape. The second region 603 may have a shape protruding from a plane including the surface of the first region 601. According to an embodiment, the inner surface of the first region 601 and the inner surface of the second region 603 may include a plate shape. However, the disclosure is not limited thereto. For example, the inner surface of the second region 603 may be concave (not illustrated) to face the protruding direction. According to an embodiment, a camera module of the electronic device may be inserted into the concave portion. The camera module of the electronic device may be protected by being inserted into the protruding portion. Furthermore, the concave portion allows the camera module to be inserted thereinto, thereby preventing the camera module from excessively protruding from the rear plate of the electronic device.

In the bonded portion 602 according to an embodiment, the first region 601 and the second region 603 may be at least partially melted and bonded to each other. It shall be understood that melting and bonding of the first region 601 and the second region 603 result in different structural characteristics from a similarly shaped transparent member 600, formed as one piece. Specifically the first region 601 may have structural properties similar to the first transparent substrate 301 and the second region 603 may have structural properties that are similar to the second transparent substrate 302. Referring to FIG. 6, the bonded portion 602 may be formed the first transparent substrate 301 and the second transparent substrate 302 are melted and bonded to each other. For example, the bonded portion 602 may refer to a portion in which the first transparent substrate 301 and the second transparent substrate 302 are melted and bonded to each other.

According to an embodiment, the transparent member 600 may be translucent or include at least one color. For example, the first region 601 may include a first color. The second region 603 may include a second color. The bonded portion 602 may include a mixture of the first color and the second color, or a third color that results from mixing the first color and the second color.

The transparent member formed through the transparent member forming method (100) according to an embodiment may include one or more microbubbles. For example, the one or more microbubbles may be formed in the bonded portion 602. The microbubbles may be formed during short-time thermoforming.

According to an embodiment, in the process of putting the transparent substrates of FIG. 3 into the lower mold (101), when the width of the gap (210 in FIG. 3) between the first transparent substrate (301 in FIG. 5) and the second transparent substrate (302 in FIG. 3) is constant, the microbubbles may be formed in the entire region of the bonded portion 602. Accordingly, when the width of the gap increases from the inner side to the outer side with reference to the surface of the completed transparent member, it is possible to prevent the microbubbles from being formed in the entire region of the bonded portion.

According to an embodiment, the size of the microbubbles may be smaller than 200 um. According to an embodiment, the size of the microbubbles may be 0 to 10 um. Accordingly, the microbubbles may be observed with a microscope. However, the disclosure is not limited thereto.

Referring to FIG. 9, the transparent member 600 according to an embodiment may include one or more side portions. For example, the edges of the transparent member 600 may include a first side portion 604, a second side portion 605, a third side portion 606, and a fourth side portion 607. The first side portion 604 and the second side portion 605 may face each other. The third side portion 606 and the fourth side portion 607 may face each other.

The side portions according to an embodiment may include a curved surface. For example, the first side portion 604 and the second side portion 605 may be bent from the first region (601 in FIG. 8) toward the inner surface 608 of the transparent member 600 to extend seamlessly. The third side portion 606 and the fourth side portion 607 may be bent from the first region (601 in FIG. 9) to extend seamlessly in a direction in which the inner surface 608 of the transparent member 600 is oriented.

According to an embodiment, the electronic device (e.g., the electronic device 10 in FIG. 1) may include the transparent member 600. The transparent member 600 may be referred to by a transparent member 500 formed through the transparent member forming method (100) of FIGS. 3 to 7. The same reference numerals are used for the same or substantially the same components as those described above, and overlapping descriptions will be omitted.

According to an embodiment, the electronic device may include a display, a rear cover, and a side housing. The rear cover may be disposed on a surface opposite to the display. The side housing may be provided to surround the space between the display and the rear cover. However, the configuration of the electronic device is not limited thereto. According to an embodiment, at least one of the above-described components may be omitted from the electronic device, or the electronic device may further include one or more other components. For example, the electronic device may further include a camera device disposed on the rear cover.

Referring to FIG. 8, the transparent member 600 according to an embodiment may configure at least a portion of the rear cover of the electronic device. For example, the first region 601 may be at least a portion of the rear plate of the electronic device. For example, the first region 601 may be a portion of the rear plate (1511 in FIG. 2) of the electronic device (1500 in FIG. 1). The second region 603 may be at least a portion of a thick portion in which the rear camera of the electronic device is located. For example, the second region 603 may be a portion of the camera module (1555 in FIG. 2) of the electronic device (1500 in FIG. 1). However, the disclosure is not limited thereto. For example, the transparent member 600 according to an embodiment may be used not only for an exterior of an electronic device including a smartphone (e.g., the electronic device 1500 in FIG. 1), but also for an exterior of any of various types of electronic devices such as a tablet personal computer (PC), a wearable device, or a home appliance (e.g., a refrigerator, a microwave oven, a washing machine, or an audio system).

Various embodiments of the disclosure disclosed in the present specification and drawings are provided merely to represent specific examples for the purpose of easily describing the technical contents of the disclosure and helping the understanding of the disclosure, and are not intended to limit the scope of the disclosure. Accordingly, the scope of the disclosure should be construed in such a manner that, in addition to the embodiments disclosed herein, all changes or modifications derived from the technical idea of the disclosure are included in the scope of the disclosure.

As described above, a transparent member forming method (100) according to an embodiment may include: inserting a first transparent substrate and a second transparent substrate into a first cavity of a lower mold having a first depth and a second cavity of a lower mold connected to the first cavity having a second depth, respectively; positioning an upper mold on to the lower mold, wherein the upper mold corresponds to the lower mold, and includes a pressing portion having at least one pressing surface; preheating at least one of the lower mold or the upper mold to a predetermined temperature; and pressing the upper mold onto the lower mold, thereby thermoforming the preheated transparent substrates.

According to an embodiment, wherein thermoforming of the preheated transparent substrates comprises, melting and bonding the first transparent substrate and the second transparent substrate to each other in the order from an inner side to an outer side of a contacting area therebetween.

According to an embodiment, the lower mold may include at least one air passage connected to the second cavity.

According to an embodiment, the lower mold may further include a one-sided core disposed in the at least one air passage.

According to an embodiment, the transparent member forming method may further include a process of polishing at least a portion of one surface of each of the thermoformed transparent substrates.

According to an embodiment, the transparent member forming method may further include a process of reinforcing the thermoformed transparent substrates.

According to an embodiment, the first transparent substrate and the second transparent substrate put into the lower mold may be disposed such that a gap is formed therebetween.

According to an embodiment, the gap may have a width that increases from an inner side toward an outer side with reference to a surface of the transparent member.

According to an embodiment, the first transparent substrate has a thickness of approximately 0.6 T.

According to an embodiment, the second transparent substrate has a thickness of approximately 2.85 T.

According to an embodiment, the predetermined temperature is 1100 C/2012 F or higher.

According to an embodiment, pressing the upper mold onto the lower mold occurs after preheating.

According to an embodiment, the pressing portion of the upper mold comprises a heating source.

According to an embodiment, preheating comprises preheating with an external heat source.

According to an embodiment, pressing the upper mold onto the lower mold comprises pressing the upper mold onto the lower mold with pressing line.

As described above, a transparent member 600 according to an embodiment may be formed through: a process of putting a first transparent substrate and a second transparent substrate into a first cavity of a lower mold that has a first depth and a second cavity of a lower mold that is connected to the first cavity and has a second depth, respectively; a process of disposing an upper mold, which corresponds to the lower mold and includes a pressing portion having at least one pressing surface, on an upper portion of the lower mold; a process of preheating at least one of the lower mold in which the transparent substrates are disposed or the upper mold to a predetermined temperature; and a process of thermoforming the preheated transparent substrates by pressing the preheated transparent substrates in a manner of pressing the upper mold.

According to an embodiment, the lower mold may include at least one air passage connected to the second cavity.

According to an embodiment, the lower mold may further include a one-sided core disposed in the at least one air passage.

According to an embodiment, the transparent member may be formed by the first transparent substrate and the second transparent substrate are bonded from an inner surface in which the first transparent substrate and the second transparent substrate are in contact in the thermoforming process.

According to an embodiment, the transparent member may be formed by performing a polishing process on at least a portion of one surface of each of the thermoformed transparent substrates.

According to an embodiment, the transparent member may be formed by performing a process of reinforcing the transparent substrate after the thermoforming process.

According to an embodiment, the transparent member may be formed by performing the thermoforming in a state in which a gap is formed between the first transparent substrate and the second transparent substrate, and the gap may have a width that increases from an inner side toward an outer side with reference to a surface of the transparent member.

As described above, the transparent member 600 according to an embodiment may include a first region having a first thickness, a second region having a second thickness greater than the first thickness, and a bonded portion in which the first region and the second region are at least partially melted and bonded to each other.

According to an embodiment, the first region may include a first color, the second region may include a second color, and the bonded portion may include a mixture of the first color and the second color.

According to an embodiment, a difference in thickness between the first region and the second region may be within a range of 0.15 mm to 2.5 mm.

As described above, an electronic device according to an embodiment may include: a display; a rear cover disposed on a surface opposite to the display; and a side housing enclosing a space between the display and the rear cover. At least one of the rear cover may include a transparent member including a first region having a first thickness, a second region thicker than the first thickness, and a bonded portion in which the first region and the second region are at least partially melted and bonded to each other.

According to an embodiment, in the transparent member, the first region may include a first color, the second region may include a second color, and the bonded portion may include a mixture of the first color and the second color.

What is claimed is:

1. A method comprising:

inserting a first transparent substrate into a first cavity of a lower mold having a first depth and a second transparent substrate into a second cavity of the lower mold connected to the first cavity and having a second depth, wherein the second depth being greater than the first depth, wherein the first transparent substrate and the second transparent substrate are inserted in a solid state;

positioning an upper mold on to the lower mold, wherein the upper mold corresponds to the lower mold and includes a pressing portion having at least one pressing surface;

preheating at least one of the lower mold or the upper mold to a predetermined temperature, thereby resulting in preheated transparent substrates; and pressing the upper mold onto the lower mold, thereby thermoforming the preheated transparent substrates such that the first transparent substrate and the second transparent substrate are bonded to each other during the thermoforming, thereby forming thermoformed transparent substrates, wherein inserting the first transparent substrate and the second transparent substrate into the lower mold further comprises inserting the first transparent substrate and the second transparent substrate adjacent to each other, such that a gap is formed therebetween, and wherein the lower mold includes a first side wall, a second side wall facing the first side wall, a third side wall substantially perpendicular to the first side wall and second side wall, and a fourth side wall facing the third side wall, wherein the gap between the first transparent substrate and the second transparent substrate includes a first portion, a second portion closer to the fourth side wall of the lower mold than the first portion in a direction from the third side wall toward the fourth side wall, a third portion, and a fourth portion closer to the second side wall of the lower mold than the third portion in a direction from the first side wall toward the second side wall, wherein a second width of the second portion is greater than a first width of the first portion to prevent microbubbles being formed during thermos forming, and wherein a fourth width of the fourth portion is greater than a third width of the third portion to prevent microbubbles being formed during thermos forming.

2. The method of claim 1, wherein the lower mold includes at least one air passage connected to the second cavity.

3. The method of claim 2, wherein the lower mold further includes a one-sided core disposed in the at least one air passage.

4. The method of claim 1, further comprising:

polishing at least a portion of one surface of each of the thermoformed transparent substrates.

5. The method of claim 1, further comprising:
reinforcing the thermoformed transparent substrates at a temperature lower than a strain point of the respective transparent substrates and above a predetermined temperature.

\* \* \* \* \*